United States Patent
Osawa

(10) Patent No.: US 7,956,646 B2
(45) Date of Patent: Jun. 7, 2011

(54) BUFFER CIRCUIT AND CONTROL METHOD THEREOF

(75) Inventor: Hiromitsu Osawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/029,778

(22) Filed: Feb. 12, 2008

(65) Prior Publication Data

US 2008/0197892 A1 Aug. 21, 2008

(30) Foreign Application Priority Data

Feb. 20, 2007 (JP) .................................. 2007-038939

(51) Int. Cl.
*H03K 19/094* (2006.01)
*H03K 19/20* (2006.01)
*H03K 5/12* (2006.01)

(52) U.S. Cl. ........................... 326/87; 327/170; 326/119

(58) Field of Classification Search .................... 326/68, 326/82, 83, 86, 87, 112, 115, 119, 121; 327/108, 327/109, 170
See application file for complete search history.

(56) References Cited

U.S. PATENT DOCUMENTS

| 5,568,081 A | * | 10/1996 | Lui et al. | 327/380 |
| 5,583,460 A | * | 12/1996 | Dohi et al. | 327/126 |
| 5,877,638 A | * | 3/1999 | Lin | 327/108 |
| 6,236,248 B1 | * | 5/2001 | Koga | 327/112 |
| 7,053,679 B2 | * | 5/2006 | Rho | 327/108 |
| 7,345,516 B2 | * | 3/2008 | Im et al. | 327/170 |

FOREIGN PATENT DOCUMENTS

| JP | 04-330822 | 11/1992 |
| JP | 09-093111 | 4/1997 |
| JP | 2003-309460 | 10/2003 |

* cited by examiner

*Primary Examiner* — Vibol Tan
*Assistant Examiner* — Dylan White
(74) *Attorney, Agent, or Firm* — Arent Fox LLP

(57) ABSTRACT

The present disclosure has been worked out to provide a buffer circuit and a control method thereof capable of controlling the timing at which the output switching element is changed from an OFF state to an ON state, and preventing the output characteristic from becoming unstable. The buffer circuit includes: a driving portion 20 driving output switching elements M1 and M2; a detecting portion 30 detecting that the voltage values of control terminals of the output switching elements M1 and M2 have exceeded the threshold voltage value; an auxiliary driving portion 40 being connected to the driving portion 20 and changing driving capability of the output switching elements M1 and M2 in accordance with the result of detection by the detecting portion 30.

16 Claims, 7 Drawing Sheets

STRUCTURE OF OUTPUT BUFFER CIRCUIT DIRECTED TO FIRST EMBODIMENT

STRUCTURE OF OUTPUT BUFFER CIRCUIT
DIRECTED TO FIRST EMBODIMENT

FIG. 2 STRUCTURE OF OUTPUT BUFFER CIRCUIT DIRECTED TO SECOND EMBODIMENT

FIG. 3 STRUCTURE OF OUTPUT BUFFER CIRCUIT DIRECTED TO THIRD EMBODIMENT

FIG. 4  STRUCTURE OF OUTPUT BUFFER CIRCUIT DIRECTED TO FOURTH EMBODIMENT

FIG. 5 STRUCTURE OF OUTPUT BUFFER CIRCUIT DIRECTED TO FIFTH EMBODIMENT

FIG. 6  STRUCTURE OF OUTPUT BUFFER CIRCUIT DIRECTED TO SIXTH EMBODIMENT

STRUCTURE OF CONVENTIONAL OUTPUT BUFFER CIRCUIT

BUFFER CIRCUIT AND CONTROL METHOD THEREOF

CROSS-REFERENCE TO RELATED APPLICATIONS

This application is based upon and claims the benefit of priority from the prior Japanese Patent Application No. 2007-038939 filed on Feb. 20, 2007, the entire contents of which are incorporated herein by reference.

BACKGROUND

1. Field

This application relates to a buffer circuit and a control method thereof.

2. Description of Related Art

In general, output signal potential characteristic in a buffer circuit may greatly fluctuate due to fluctuations of a threshold value of MOS transistors caused by process fluctuation. Japanese Unexamined Patent Publication No. 9(1997)-93111 discloses a buffer circuit in which fluctuations of the output signal potential characteristic are suppressed.

The buffer circuit is provided with a first slew rate circuit and a second slew rate circuit. The first slew rate circuit has an input/output characteristic according to which, if an input potential of a signal input node is changed from a high level to a low level, a potential of a first output node rises rapidly from a low level, until the input signal potential becomes near ½ of a power supply potential, and a potential of the first output node rises slowly to a high level from a vicinity where the output signal potential at the output node dropped below ½ of the power supply potential. Further, the first slew rate circuit has an input/output characteristic according to which, if the input potential at a signal input node is changed from a low level to a high level, the potential at a first output node drops sharply from a high level to a low level.

The second slew rate circuit has an input/output characteristic according to which, if an input potential at a signal input node is changed from a high level to a low level, a potential at the second output node rises rapidly from a low level to a high level. Further, the second slew rate circuit has an input/output characteristic according to which, if an input potential at the signal input node is changed from a low level to a high level, a potential at the second output node drops rapidly from a high level until the input signal potential becomes near ½ of the power supply potential, and a potential at a second output node drops slowly approximately from where the output signal potential at the output node exceeds ½ of the power supply potential until it becomes a low level.

The above-described buffer circuit rapidly raises or drops the input waveforms of the output buffer circuit connected to the first and the second slew rate circuits up to ½ of the power supply voltage, depending on the input/output characteristic of the first and second slew rate circuits, after which, it slowly changes the input waveforms. In this buffer circuit, since the input waveforms of the output buffer circuit are rapidly raised or dropped up to ½ of the power supply voltage, and the output signal potential of the output buffer circuit exceeds an inversion region, it is possible to suppress the delay of the output signal potential with respect to the input potential.

An output buffer circuit 100 is known which is provided with a delay circuit 110 and an auxiliary driving circuit 120, as shown in FIG. 7, and in which a P-type channel transistor M71 and an N-type channel transistor M72 that constitute output switching elements are quickly changed from an OFF state to an ON state.

If an input signal inputted from an input terminal (IN) is changed from a high level to a low level in the above-described output buffer circuit 100, operation is carried out in the following manner. In this output buffer circuit 100, right after the input signal is changed from a high level to a low level, the gate voltage of the N-type channel transistor M74 is fixed to a low level voltage, so that the N-type channel transistor M74 enters an OFF state. At this time, the gate voltage of the P-type channel transistor M73 is fixed to a low level voltage, so that the P-type channel transistor M73 enters an ON state.

In addition, right after the input signal is changed from a high level to a low level, a delay circuit 110A inputs a low level delay signal obtained by delaying a high level input signal to a gate of the P-type channel transistor M75 in the auxiliary driving circuit 120. As a result, the gate voltage of the P-type channel transistor M75 is fixed to a low level voltage, so that the P-type channel transistor M75 enters an ON state. When the P-type channel transistor M73 and the P-type channel transistor M75 enter an ON state, respectively, a source current path L51 is formed as shown in the drawing. The source current path L51 extends from a power supply voltage Vdd to a gate of the N-type channel transistor M72 by passing through the P-type channel transistors M75 and M73.

Since the gate of the P-type channel transistor M76 is connected to a ground, the gate voltage of the transistor M76 is fixed to a low level voltage. As a result, the P-type channel transistor M76 is fixed to an ON state. When the P-type channel transistor M73 and the P-type channel transistor M76 enter an ON state, respectively, a source current path L52 is formed as shown in the drawing. The source current path L52 extends from the power supply voltage Vdd to a gate of the N-type channel transistor M72 by passing through the P-type channel transistors M76 and M73.

The forming of the source current path L52 in addition to the source current path L51 in the above-described output buffer circuit 100 helps increase the current driving capability of the source current path with respect to the N-type channel transistor M72. Consequently, the time required to approximate the gate voltage of the N-type channel transistor 72 to a threshold voltage is shortened. Thus, in the output buffer circuit 100, the time until the N-type channel transistor M72 is changed from an OFF state into an ON state, is shortened, with the threshold voltage set as a boundary.

On the other hand, in the above-described output buffer circuit 100, if the input signal is changed from a low level to a high level, a sink current path L62 is formed separately from a sink current path L61, by using the delay circuit 110B and the N-type channel transistor M80 of the auxiliary driving circuit 120. As a result, the current driving capability of the sink current path with respect to the P-type channel transistor M71 is increased. Consequently, the time required by the gate voltage of the P-type channel transistor M71 to approximate to a threshold voltage is shortened. Thus, similarly with the above-described N-type channel transistor M72, the time until the P-type channel transistor M71 is changed from an OFF state into an ON state is shortened. The symbols M78, M80 and M81 in the drawing show N-type channel transistors, respectively. Symbol 79 shows a P-type channel transistor.

However, in the above-described output buffer circuit 100, there may be cases that process fluctuation may cause fluctuations in the delay time of the respective delay circuits 110A and 110B and fluctuations in the threshold voltage of both transistors M75 and M80 of the auxiliary driving circuit 120.

In such a case, the fact that the timing at which the delay signals are outputted from the delay circuits 110 and 110B to respective gates of the transistors M75 and M80 differs, and the fact that the output timing of the respective delay signals differs may have an effect and may cause fluctuations in the time required to form the source current path L51 and the sink current path L62.

In the above-described output buffer circuit 100, when the time required to form the source current path L51 and the sink current path L62 fluctuates, it is believed that the time required by the gate voltage of transistors M71 and M72 to approximate to the threshold voltage fluctuates. Accordingly, in the above-described output buffer circuit 100, if the time required by the gate voltage of transistors M71 and M72 to approximate to the threshold voltage fluctuates, it is believed that the timing at which transistors M71 and M72 are changed from an OFF state to an ON state fluctuates, which may cause fluctuations in the slew rate.

When the slew rate fluctuates, it is believed that a response delay occurs in the output signal to be outputted from the output terminal (OUT) of the output buffer circuit 100, with respect to the input signal. Due to this, in the above-described output buffer circuit 100, the response delay in the output signal may have an effect, which may make the output characteristic become unstable.

SUMMARY

According to a first aspect of the present embodiment, there is provided a buffer circuit comprising: a driving portion driving an output switching element; a detecting portion detecting that a voltage value of a control terminal of the output switching element has exceeded a threshold voltage value; and an auxiliary driving portion connected to the driving portion, the auxiliary driving portion changing driving capability of the output switching element in accordance with a result of detection by the detecting portion.

According to the buffer circuit according to the first aspect of the present embodiment, if an auxiliary driving portion is provided which is connected to the driving portion that drives the output switching element and is adapted to change the driving capability of the output switching element in accordance with the detection results of the detecting portion, the voltage value of the control terminal of the output switching element can be increased or decreased in accordance with the detection results of the detecting portion, depending on the driving capability of the output switching element which are set by the auxiliary driving portion.

According to the buffer circuit according to the first aspect of the present embodiment, if the voltage value of the control terminal of the output switching element is increased by the auxiliary driving portion, the output switching element can be quickly changed from a non-conductive state into a conductive state, which allows to increase the slew rate of the buffer circuit. If the voltage value of the control terminal of the output switching element is decreased by the auxiliary driving portion, the conductive state of the output switching element can be restricted, so that the slew rate of the buffer circuit can be returned to a standard value based on the driving capability of the output switching element set by the driving portion.

According to a second aspect of the present embodiment, there is provided a control method of a buffer circuit, comprising the steps of: driving an output switching element; detecting that a voltage value of a control terminal of the output switching element has exceeded a threshold voltage value; and auxiliary driving to change driving capability of the output switching element in the step of driving, in accordance with a result of detection by the step of detecting.

According to the control method of the buffer circuit according to the second aspect of the present embodiment, if the step of auxiliary driving is provided which changes the driving capability of the output switching element in the step of driving, the voltage value of the control terminal of the output switching element can be increased or decreased in accordance with the detection results of the step of detecting, depending on the driving capability of the output switching element which are set by the step of auxiliary driving.

According to the control method of the buffer circuit according to the second aspect of the present embodiment, if the voltage value of the control terminal of the output switching element is increased by the step of auxiliary driving, the output switching element can be quickly changed from a non-conductive state into a conductive state, which allows to increase the slew rate of the buffer circuit. If the voltage value of the control terminal of the output switching element is decreased by the step of auxiliary driving, the conductive state of the output switching element can be restricted, so that the slew rate of the buffer circuit can be returned to a standard value based on the driving capability of the output switching element set by the step of driving.

The present disclosure has been worked out in view of the above-described situation, and an object thereof is to provide a buffer circuit and a control method thereof capable of controlling the timing at which the output switching element is changed from an OFF state to an ON state, and preventing the output characteristic from becoming unstable.

The above and further novel features of the disclosure will more fully appear from the following detailed description when the same is read in connection with the accompanying drawings. It is to be expressly understood, however, that the drawings are for the purpose of illustration only and are not intended as a definition of the limits of the disclosure.

DETAILED DESCRIPTION OF THE PREFERRED EMBODIMENTS

First Embodiment

Figure 1:
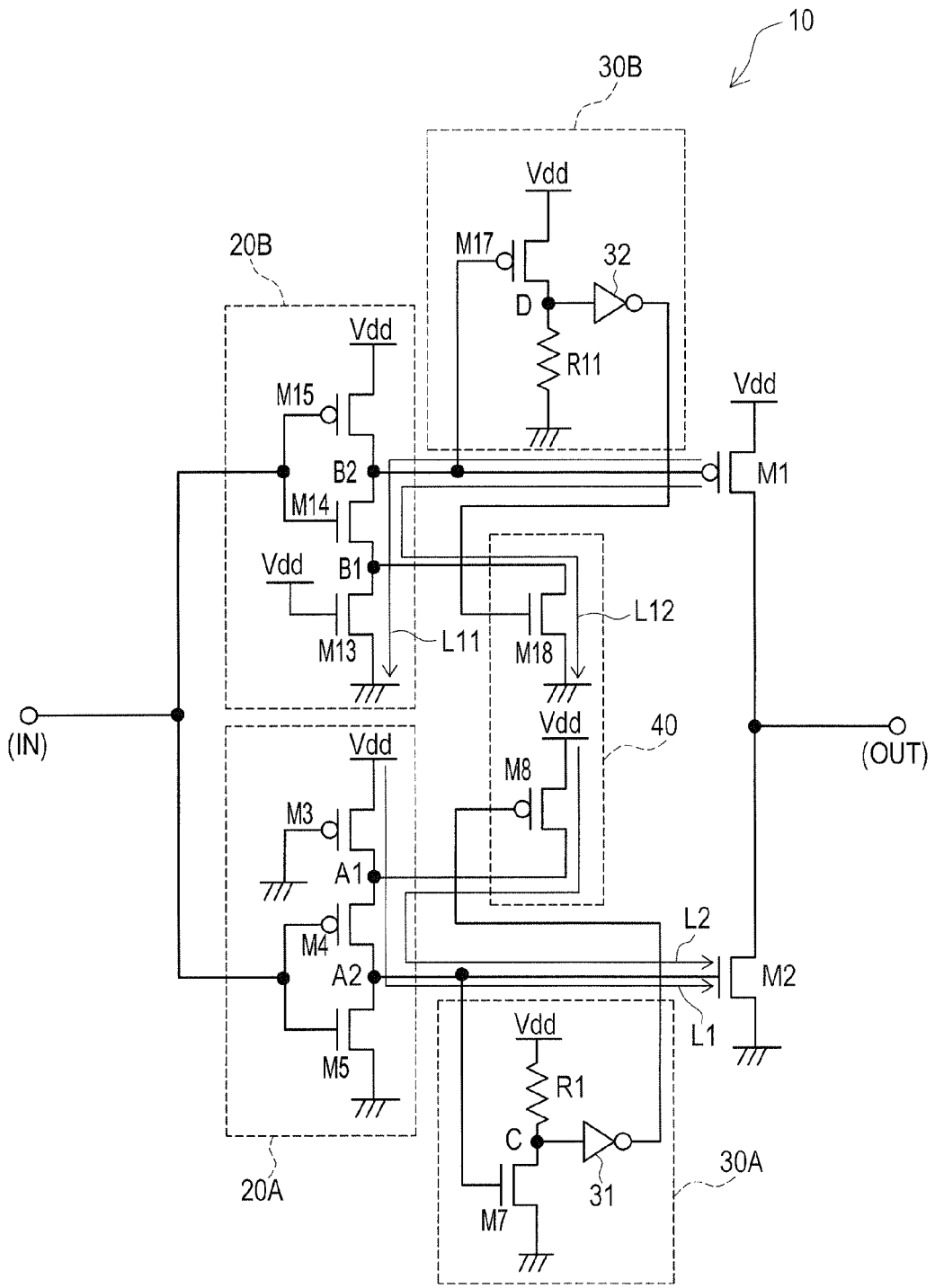
FIG. 1 is a circuit configuration diagram of an output buffer circuit directed to a first embodiment.
Figure 7:
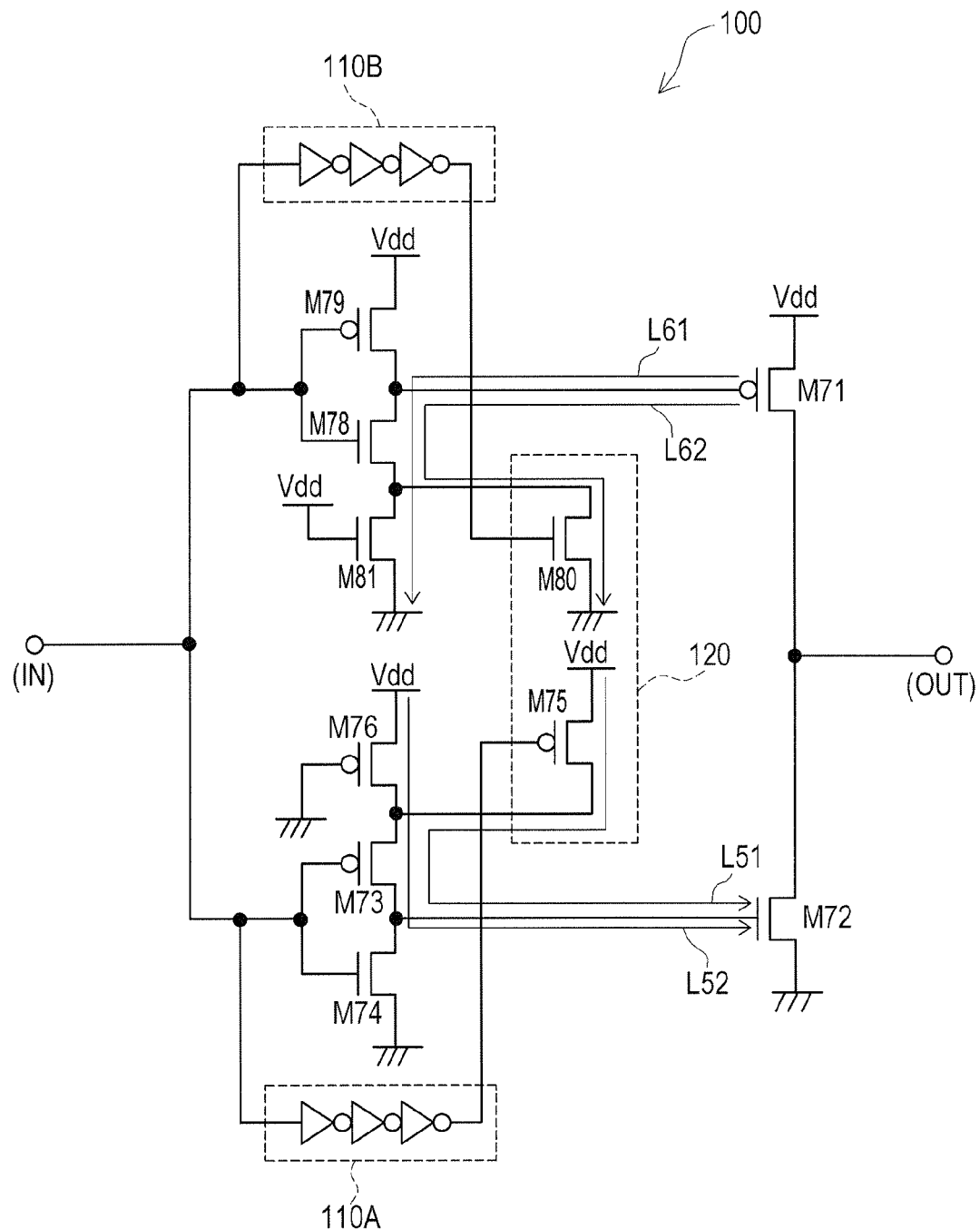
FIG. 7 is a circuit configuration diagram of a conventional output buffer circuit.

A first embodiment of the present disclosure will be described while referring to FIG. 1. Here, the buffer circuit of the present disclosure will be described by taking an output buffer circuit 10 as an example. FIG. 1 is a circuit configuration diagram of the output buffer circuit 10. In FIG. 1, devices, etc. which are the same as those of FIG. 7 are denoted by the same numerical symbols. The output buffer circuit 10 is provided with a P-type channel transistor M1, an N-type channel transistor M2, first gate voltage control circuits 20A and 20B, first gate voltage detecting circuits 30A and 30B, and a second gate voltage control circuit 40. The P-type channel transistor M1 and the N-type channel transistor M2 correspond to the output switching elements of the present disclosure. The first gate voltage control circuits 20A and 20B correspond to the driving portions of the present disclosure. The first gate voltage detecting circuits 30A and 30B correspond to the detecting portions of the present disclosure. The second gate voltage control circuit 40 corresponds to the auxiliary driving portion of the present disclosure.

A source of the P-type channel transistor M1 is connected to a power supply voltage Vdd (power supply line) A drain of the P-type channel transistor M1 is connected to a drain of the N-type channel transistor M2. A source of the N-type channel transistor M2 is connected to a ground. Further, the drain of the P-type channel transistor M1 and the drain of the N-type channel transistor M2 are connected to an output terminal (OUT).

The first gate voltage control circuit 20A is provided with a P-type channel transistor M3, a P-type channel transistor M4 and an N-type channel transistor M5. A source of the P-type channel transistor M3 is connected to the power supply voltage Vdd (power supply line). A gate of the P-type channel transistor M3 is connected to the ground. A drain of the P-type channel transistor M3 is connected to a source of the P-type channel transistor M4. Symbol A1 in the drawing shows a connection point between the drain of the P-type channel transistor M3 and the source of the P-type channel transistor M4.

A drain of the P-type channel transistor M4 is connected to a drain of the N-type channel transistor M5. A connection point A2 between the drain of the P-type channel transistor M4 and the drain of the N-type channel transistor M5 is connected to a gate of the N-type channel transistor M2. A source of the P-type channel transistor M5 is connected to the ground. A gate of the P-type channel transistor M4 and a gate of the N-type channel transistor M5 are connected to an input terminal (IN).

The first gate voltage control circuit 20B is provided with an N-type channel transistor M13, an N-type channel transistor M14 and a P-type channel transistor M15. A source of the N-type channel transistor M13 is connected to the ground. A gate of the N-type channel transistor M13 is connected to the power supply voltage Vdd (power supply line). The drain of the N-type channel transistor M13 is connected to the source of the N-type channel transistor M14. Symbol B1 in the drawing shows a connection point between the drain of the N-type channel transistor M13 and the source of the N-type channel transistor M14.

A drain of the N-type channel transistor M14 is connected to a drain of the P-type channel transistor M15. A connection point B2 between the drain of the N-type channel transistor M14 and the drain of the P-type channel transistor M15 is connected to a gate of the P-type channel transistor M1. A source of the P-type channel transistor M15 is connected to the power supply voltage Vdd (power supply line). A gate of the N-type channel transistor M14 and a gate of the P-type channel transistor M15 are connected to the input terminal (IN).

The first gate voltage detecting circuit 30A is provided with an N-type channel transistor M7, a resistor R1 and an inverter 31. A gate of the N-type channel transistor M7 is connected to the connection point A2 between the gate of the N-type channel transistor M2 and the first gate voltage control circuit 20A. The N-type channel transistor M7 corresponds to the first switching element of the present disclosure. The gate of the N-type channel transistor M7 corresponds to the first control terminal of the first switching element of the present disclosure. The gate of the N-type channel transistor M2 corresponds to the control terminal of the output switching element of the present disclosure. A source of the N-type channel transistor M7 is connected to the ground. A drain of the N-type channel transistor M7 is serially connected to one terminal of resistor R1. The other terminal of the resistor R1 is serially connected to the power supply voltage Vdd (power supply line). The resistor R1 corresponds to the first resistor element of the present disclosure. A connection point C between the drain of the N-type channel transistor M7 and a terminal of the resistor R1 is connected to an input of the inverter 31.

In the present embodiment, the N-type channel transistor M7 is manufactured by using the same manufacturing process as that used for the N-type channel transistor M2. Because of this, the value of the threshold voltage of the N-type channel transistor M7 is set to be the same as the value of the threshold voltage of the N-type channel transistor M2.

The first gate voltage detecting circuit 30B is provided with a P-type channel transistor M17, a resistor R11 and an inverter 32. A gate of the P-type channel transistor M17 is connected to the connection point B2 between the gate of the P-type channel transistor M1 and the first gate voltage control circuit 20B. The P-type channel transistor M17 corresponds to the first switching element of the present disclosure. The gate of the P-type channel transistor M17 corresponds to the first control terminal of the first switching element of the present disclosure. The gate of the P-type channel transistor M1 corresponds to the control terminal of an output switching element of the present disclosure. A source of the P-type channel transistor M17 is connected to the power supply voltage Vdd (power supply line). A drain of the P-type channel transistor M17 is serially connected to one terminal of the resistor R11. The other terminal of the resistor R11 is serially connected to the ground. The resistor R11 corresponds to the first resistor element of the present disclosure. A connection point D between the drain of the P-type channel transistor M17 and one terminal of the resistor R11 is connected to the input of the inverter 32.

In the present embodiment, the P-type channel transistor M17 is manufactured by using the same manufacturing process as that used for the P-type channel transistor M1. Because of this, the value of the threshold voltage of the P-type channel transistor M17 is set to be the same as the value of the threshold voltage of the P-type channel transistor M1.

The second gate voltage control circuit 40 is provided with a P-type channel transistor M8 and an N-type channel transistor M18. A source of the P-type channel transistor M8 is connected to the power supply voltage Vdd (power supply line). A gate of the P-type channel transistor M8 is connected to an output of the inverter 31 which is provided in the first gate voltage detecting circuit 30A. A drain of the P-type channel transistor M8 is connected to a connection point A1 of the first gate voltage control circuit 20A. The P-type channel transistor M8 corresponds to the second switching element of the present disclosure. The gate of the P-type channel transistor M8 is connected to the connection point C through the inverter 31, which means that this corresponds to the second control terminal of the second switching element of the present disclosure.

A source of the N-type channel transistor M18 is connected to the ground. A gate of the N-type channel transistor M18 is connected to the output of the inverter 32 which is provided in the first gate voltage detecting circuit 30B. The drain of the N-type channel transistor M18 is connected to the connection point B1 of the first gate voltage control circuit 20B. The N-type channel transistor M18 corresponds to the second switching element of the present disclosure. The gate of the N-type channel transistor M18 is connected to the connection point D, through the inverter 32, which means that this corresponds to the second control terminal of the second switching element of the present disclosure.

Next, the operation of the output buffer circuit 10 according to the present embodiment will be described. If the data signal to be inputted from the input terminal (IN) is changed from a high level to a low level, the output buffer circuit 10 operates as will be described in the following text. Description on operation which is the same as that of the output buffer circuit 100 shown in FIG. 7 is hereby omitted.

In the output buffer circuit 10, if the input signal is maintained at a high level, the gate voltage of the P-type channel transistor M4 is fixed to a high level voltage so that the P-type channel transistor M4 enters an OFF state. At this time, the gate voltage of the N-type channel transistor M5 is fixed to a high level voltage, so that the N-type channel transistor M5 enters an ON state. As a result, a sink current path with respect to the N-type channel transistor M2 is formed. The sink current path extends from the gate of the N-type channel transistor M2 to the ground, by passing through the N-type channel transistor M5. As a result of forming the sink current path, the gate voltage of the N-type channel transistor M2 is fixed to a low level voltage, so that the N-type channel transistor M2 is maintained in an OFF state.

Since the gate of the N-type channel transistor M7 is connected to the gate of the N-type channel transistor M2, when the gate voltage of the N-type channel transistor M2 is fixed to a low level voltage, the gate voltage of the N-type channel transistor M7 is fixed to a low level voltage. As a result, the N-type channel transistor M7 enters an OFF state.

The input of the inverter 31 receives a high level signal, based on the potential occurring at the connection point C. The inverter 31 outputs a low level signal to the gate of the P-type channel transistor M8. As a result, the gate voltage of the P-type channel transistor M8 is fixed to a low level voltage, so that the P-type channel transistor M8 is maintained in an ON state.

In addition, since the gate of the P-type channel transistor M3 is connected to the ground, the gate voltage of the transistor M3 is fixed to a low level voltage. Here, the P-type channel transistor M3 is maintained in an ON state.

Then, when the input signal is changed from a high level to a low level, the gate voltage of the P-type channel transistor M4 is fixed to a low level voltage, so that the P-type channel transistor M4 enters an ON state. At this time, the gate voltage of the N-type channel transistor M5 is fixed to a low level voltage, so that the N-type channel transistor M5 enters an OFF state. As a result, the P-type channel transistor M3 and the P-type channel transistor M4 enter an ON state, to form the source current path L1 as shown in the drawing. The source current path L1 extends from the power supply voltage Vdd to the gate of the N-type channel transistor M2, by passing through the P-type channel transistor M3 and the P-type channel transistor M4.

At the same time, since the P-type channel transistor M8 is maintained in an ON state, the source current path L2 shown in the drawing is formed by the transistor M8 and the P-type channel transistor M4 which is in an ON state. The source current path L2 extends from the power supply line to the gate of the N-type channel transistor M2, by passing through the P-type channel transistor M8 and the P-type channel transistor M4.

As a result of forming, in the output buffer circuit 10 of the present embodiment, the source current path L2 in addition to the source current path L1, the current driving capability of the source current path with respect to the N-type channel transistor M2 is increased. Consequently, the speed at which the gate voltage of the N-type channel transistor M2 is boosted is increased, which shortens the time required by the gate voltage to approximate to the threshold voltage. In addition, in the present embodiment, since the gate of the N-type channel transistor M7 is connected to the gate of the N-type channel transistor M2, the time required by the gate voltage of the N-type channel transistor M7 to approximate to the threshold voltage is shortened, in association with an increase in the current driving capability of the source current path with respect to the N-type channel transistor M2 manufactured by using the same manufacturing process as that used for the transistor M7.

Since the value of the threshold voltage of the N-type channel transistor M7 is set to the same value as the value of the threshold voltage of the N-type channel transistor M2, when the gate voltage of the N-type channel transistor M2 reaches the threshold voltage, the gate voltage of the N-type channel transistor M7 also reaches the threshold voltage.

When the gate voltage of the N-type channel transistor M7 exceeds the threshold voltage, the N-type channel transistor M7 enters an ON state. As a result, the current path extending from the power supply line to the ground through the resistor R1 is formed so that the potential occurring at the connection point C drops. The input of the inverter 31 receives a low level signal based on the potential that dropped. The inverter 31 outputs a high level signal to the gate of the P-type channel transistor M8. As a result, the gate voltage of the P-type channel transistor M8 is fixed to a high level voltage, so that the P-type channel transistor M8 enters an OFF state.

When the P-type channel transistor M8 enters an OFF state, the source current path L2 is blocked, and subsequently, the source current path L1 is formed. In this case, the current driving capability of the source current path with respect to the N-type channel transistor M2 is reduced as compared to the case that the source current path L2 is formed, in addition the source current path L1. Here, the speed at which the gate voltage of the N-type channel transistor M2 is boosted is delayed when using one source current path L1, as compared to the boost speed required by the gate voltage of the N-type channel transistor M2 to reach the threshold voltage when using the two source current paths L1 and L2.

Also, in the output buffer circuit 10, if the input signal is maintained at a high level, the gate voltage of the N-type channel transistor M14 is fixed to the high level voltage, so that the N-type channel transistor M14 enters an ON state. At this time, the gate voltage of the P-type channel transistor M15 is fixed to a high level voltage, so that the P-type channel transistor M15 enters an OFF state.

Further, since the gate of the N-type channel transistor M13 is connected to the power supply voltage Vdd, the gate voltage of the transistor M13 is fixed to a high level voltage. Here, the N-type channel transistor M13 is maintained in an ON state. When the N-type channel transistor M14 and the N-type channel transistor M13 enter an ON state, respectively, a sink current path with respect to the P-type channel transistor M1 is formed. The sink current path extends from the gate of the P-type channel transistor M1 to the ground, by passing through the N-type channel transistor M14 and the N-type channel transistor M13. As a result of forming the sink current path, the gate voltage of the P-type channel transistor M1 is fixed to a low level voltage, so that the P-type channel transistor M1 is maintained in an ON state.

On the other hand, if the data signal inputted from the input terminal (IN) is changed from a low level to a high level, the output buffer circuit 10 of the present embodiment operates in the following manner. In the output buffer circuit 10, if the input signal is maintained at a low level, the gate voltage of the N-type channel transistor M14 is fixed to a low level voltage, so that the N-type channel transistor M14 enters an OFF state. At this time, the gate voltage of the P-type channel transistor M15 is fixed to a low level voltage, so that the P-type channel transistor M15 enters an ON state. As a result, a source current path with respect to the P-type channel transistor M1 is formed. The source current path extends from the power supply line to the gate of the P-type channel transistor M1, by passing through the P-type channel transistor M15. As a result of forming this source current path, the gate voltage of the P-type channel transistor M1 is fixed to a high level voltage, so that the P-type channel transistor M1 is maintained in an OFF state.

Since the gate of the P-type channel transistor M17 is connected to the gate of the P-type channel transistor M1, when the gate voltage of the P-type channel transistor M1 is fixed to a high level voltage, the gate voltage of the P-type channel transistor M17 is fixed to a high level voltage. As a result, the P-type channel transistor M17 enters an OFF state.

The input of the inverter 32 receives a low level signal based on the potential at the connection point D (ground potential). The inverter 32 outputs a high level signal to the gate of the N-type channel transistor M18. As a result, the gate voltage of the N-type channel transistor M18 is fixed to a high level voltage, so that the N-type channel transistor M18 is maintained in an ON state.

In addition, since the gate of the N-type channel transistor M13 is connected to the power supply voltage Vdd, the gate voltage of the transistor M13 is fixed to a high level voltage. Here, the N-type channel transistor M13 is maintained in an ON state.

Then, when the input signal is changed from a low level to a high level, the gate voltage of the N-type channel transistor M14 is fixed to a high level voltage, so that the N-type channel transistor M14 enters an ON state. At this time, the gate voltage of the P-type channel transistor M15 is fixed to a high level voltage, so that the P-type channel transistor M15 enters an OFF state. As a result, the N-type channel transistor M14 and the N-type channel transistor M13 enter an ON state, and a sink current path L11 as shown in the drawing is formed. The sink voltage path L11 extends from the gate of the P-type channel transistor M1 to the ground, by passing through the N-type channel transistor M14 and the N-type channel transistor M13.

At the same time, since the N-type channel transistor M18 is maintained in an ON state, a sink current path L12 as shown in the drawing is formed by the transistor M18 and the N-type channel transistor M14 which is in an ON state. The sink current path L12 extends from the gate of the P-type channel transistor M1 to the ground, by passing through the N-type channel transistor M18, via the N-type channel transistor M14.

In the output buffer circuit 10 of the present embodiment, as a result of forming the sink current path L12 in addition to the sink current path L11, the current driving capability of the sink current path with respect to the P-type channel transistor M1 is increased. As a result, the speed at which the gate voltage of the P-type channel transistor M1 is stepped down is increased, which shortens the time required by the gate voltage to approximate to the threshold value. In addition, in the present embodiment, since the P-type channel transistor M17 is connected to the gate of the P-type channel transistor M1, the time required by the gate voltage of the P-type channel transistor M17 to approximate to the threshold voltage is shortened, in association with an increase in the current driving capability of the sink current path with respect to the P-type channel transistor M1 manufactured using the same manufacturing process as that for the transistor M17.

Since the value of the threshold voltage of the P-type channel transistor M17 is set to the same value as the value of the threshold voltage of the P-type channel transistor M1, when the gate voltage of the P-type channel transistor M1 reaches the threshold voltage, the gate voltage of the P-type channel transistor M17 also reaches the threshold voltage.

After the gate voltage of the P-type channel transistor M17 reaches the threshold voltage, the P-type channel transistor M17 enters an ON state. As a result, a current path extending from the power supply line to the ground, by passing through the P-type channel transistor M17, via the resistor R11 is formed, so that the potential at the contact point D is boosted. The input of the inverter 32 receives a high level signal based on the potential at the connection point D. The inverter 32 outputs a low level signal to the gate of the N-type channel transistor M18. As a result, the gate voltage of the N-type channel transistor M18 is fixed to a low level voltage, so that the N-type channel transistor M18 enters an OFF state.

When the N-type channel transistor M18 enters an OFF state, the sink current path L12 is blocked, and subsequently, the sink current path L11 is formed. In this case, the current driving capability of the sink current path with respect to the P-type channel transistor M1 decreases, as compared to the case that the sink current path L12 is formed in addition to the sink current path L1. Here, the speed at which the gate voltage of the P-type channel transistor M1 is stepped down is reduced when one sink current path L11 is used, as compared to the step-down speed required by the gate voltage of the P-type channel transistor M1 to reach the threshold voltage, when two sink current paths L11 and L12 are used.

In the present embodiment, the entering of the P-type channel transistor M3 and the P-type channel transistor M4 in an ON state to form the source current path L1, and the entering of the N-type channel transistor M14 and the N-type channel transistor M13 in an ON state to form the sink current path L11 correspond to the step of driving of the present disclosure.

In the present embodiment, the exceeding of the threshold voltage by the gate voltage of the N-type channel transistor M7 manufactured by using the same manufacturing process as that used for the N-type channel transistor M2 corresponds to the detecting step of the present disclosure. Further, in the present embodiment, the reaching of the threshold voltage by the gate voltage of the P-type channel transistor M17 manufactured by using the same manufacturing process as that used for the P-type channel transistor M1 corresponds to the step of detecting of the present disclosure.

In the present disclosure, the entering of the P-type channel transistor M8 in an ON state or an OFF state in response to the output signal of the inverter 31, to form or block the source current path L2, thereby changing the current driving capability of the source current path with respect to the N-type channel transistor M2 corresponds to the step of auxiliary driving of the present disclosure. Further, in the present embodiment, the entering of the N-type channel transistor M18 in an ON state or an OFF state in response to the output signal of the inverter 32 to form or block the sink current path L12 and thereby change the current driving capability of the sink current path with respect to the P-type channel transistor M1 corresponds to the step of auxiliary driving of the present disclosure.

Effects of the First Embodiment

The output buffer circuit 10 of the present embodiment is provided with the second gate voltage control circuit 40 that is connected to first gate voltage control circuits 20A and 20B that respectively form the source current path L1 with respect to the N-type channel transistor M2, or the sink current path L11 with respect to the P-type channel transistor M1, and is adapted to form or block the source current path L2 with respect to the N-type channel transistor M2, or form or block the sink current path L12 with respect to the P-type channel transistor M1 depending on whether the gate voltage of the N-type channel transistor M7 of the first gate voltage detecting circuit 30A or the gate voltage of the P-type channel transistor M17 of the first gate voltage detecting circuit 30B exceeded the threshold voltage, to thereby respectively increase or decrease the current driving capability of the source current path with respect to the N-type channel transistor M2, or the current driving capability of the sink current path with respect to the P-type channel transistor M1.

In the output buffer circuit 10, the gate voltage of the N-type channel transistor M2 and the gate voltage of the P-type channel transistor M1 can be respectively boosted or stepped down in accordance with the current driving capability of the source current path with respect to the N-type channel transistor M2 and the current driving capability of the sink current path with respect to the P-type channel transistor M1. Here, according to the output buffer circuit 10, the source current path L2 is formed by the second gate voltage control unit 40 in addition to the source current path L1, and the sink current path L12 is formed by the second gate voltage control circuit 40 in addition to the sink current path L11, so that the time required by the gate voltage of the transistors M2 and M1 to reach the threshold voltage is shortened. As a result, in the output buffer circuit 10, transistors M2 and M1 can be quickly changed from an OFF state to an ON state, which allows increasing the slew rate. In the output buffer circuit 10, the response delay with respect to the data input signal can thus be suppressed, thereby making it possible to adjust the output characteristic of the output buffer circuit 10.

According to the output buffer circuit 10, after the source current path L2 has been blocked by the second gate voltage control circuit 40, the source current path L1 is subsequently formed by the first gate voltage control circuit 20A, and after the sink current path L12 is blocked by the second gate voltage control circuit 40, the sink current path L12 is subsequently formed by the first gate voltage control circuit 20B. As a result, the current driving capability of the source current path with respect to the N-type channel transistor M2 and the current driving capability of the sink current path with respect to the P-type channel transistor M1 are respectively decreased as compared to the case that the two source current paths L1 and L2 and the two sink current paths L11 and L12 are respectively formed. The time required to boost the gate voltage of the N-type channel transistor M2 and the time required to step down the gate voltage of the P-type channel transistor M1 can be delayed, as compared to the case that the two source current paths L1 and L2 and the two sink current paths L11 and L12 are respectively formed, which makes it possible to return the slew rate of the output buffer circuit 10 to a standard value decided by the source current path L1 or sink current path L11.

According to a control method of the output buffer circuit 10, the gate voltage of the N-type channel transistor M2 and the gate voltage of the P-type channel transistor M1 can be respectively boosted or stepped down in accordance with the current driving capability of the source current path with respect to the N-type channel transistor M2 and current driving capability of the of the sink current path with respect to the P-type channel transistor M1. Here, according to the control method of the output buffer circuit 10, the source current path L2 is formed in addition to the source current path L1, and the sink current path L12 is formed in addition to the sink current path L11, which helps shorten the time required by the gate voltages of the transistors M2 and M1 to reach the threshold voltage. As a result, the transistors M2 and M1 can be quickly changed from an OFF state to an ON state, which allows increasing the slew rate. According to the control method of the output buffer circuit 10, the response delay with respect to the data input signal can thus be suppressed, thereby making it possible to adjust the output characteristic of the output buffer circuit 10.

Further, according to the control method of the output buffer circuit 10, after the source current path L2 is blocked, the source current path L1 is subsequently formed, and after the sink current path L12 is blocked, the sink current path L11 is subsequently formed. As a result, the current driving capability of the source current path with respect to the N-type channel transistor M2 and the current driving capability of the sink current path with respect to the P-type channel transistor M1 are respectively decreased as compared to the case that two source current paths L1 and L2 and two sink current paths L11 and L12 are respectively formed. Here, the time required to boost the gate voltage of the N-type channel transistor M2 and the time required to step down the gate voltage of the P-type channel transistor M1 can be delayed as compared to the case that the two source current paths L1 and L2 and the two sink current paths L11 and L12 are respectively formed, which allows the slew rate of the output buffer circuit 10 to be returned to a standard value determined by the source current path L1 or the sink current path L11.

In the output buffer circuit 10 of the present embodiment, the first gate voltage detecting circuit 30A is provided with an N-type channel transistor M7 which has a gate connected to the gate of the N-type channel transistor M2, and the first gate voltage detecting circuit 30B is provided with a P-type channel transistor M17 which has a gate connected to the gate of the P-type channel transistor M1. Here, if the gate voltages of the transistors M2 and M1 reach the threshold voltage so that the transistors M2 and M1 enter an ON state, the N-type channel transistor M7 in which the value of the threshold voltage is the same as the value of the threshold voltage of the N-type channel transistor M2, and the P-type channel transistor M17 in which the value of the threshold voltage is the same as the value of the threshold voltage of the P-type channel transistor M1 enter an ON state, respectively. When the transistors M7 and M17 in the output buffer circuit 10 have entered in an ON state, detection can be made that the gate voltages of transistors M2 and M1 have reached the threshold voltage.

In the output buffer 10 of the present embodiment, the first gate voltage detecting circuit 30A is provided with the resistor R1 which is arranged between the power supply line and the ground and is serially connected to the drain of the N-type channel transistor M7, and the first gate voltage detecting circuit 30B is provided with the resistor R11 which is arranged between the power supply line and the ground and is serially connected to the drain of the P-type channel transistor M17. When the N-type channel transistor M7 in the output buffer circuit 10 enters an ON state or an OFF state, the potential occurring at the connection point C between the transistor M7 and the resistor R1 is changed, and when the P-type channel transistor M17 enters an ON state or an OFF state, the potential occurring at the connection point D between the transistor M17 and the resistor R11 is changed. Here, a detection can be made that the N-type channel transistor M2 and the N-type channel transistor M7 have entered an ON state or an OFF state, and a detection can be made that the P-type channel transistor M1 and the P-type channel transistor M17 have entered an ON state or an OFF state in accordance with the change in the potential occurring at the connection points C and D in the output buffer circuit 10. Thus, a detection can be made in the output buffer circuit 10 as to whether the gate voltages of the transistors M2 and M1 have reached the threshold value, based on the result that a detection was made that the N-type channel transistor M2 and the P-type channel transistor M1 have entered an ON state or an OFF state.

In the output buffer circuit 10 according to the present embodiment, the second gate voltage control circuit 40 is provided with the P-type channel transistor M8 that has a gate connected to the connection point C through the inverter 31, and is also provided with the N-type channel transistor M18 that has a gate connected to the connection point D through the inverter 32. The gate voltages of the transistors M8 and M18 in the output buffer circuit 10 can be changed in accordance with a change in the potentials occurring at the connection points C and D. Here, in the output buffer circuit 10, the transistors M8 and M18 can be controlled to enter an ON state or an OFF state in accordance with the gate voltages of the transistors M8 and M18, to thus allow the formation of source current path L2 and sink current path L12, and the blocking of the source current path L2 and the sink current path L12. As a result of forming or blocking the source current path L2 in the output buffer circuit 10, the current driving capability of the source current path with respect to the N-type channel transistor M2 can be changed. Also, as a result of forming or blocking the sink current path L12, the current driving capability of the sink current path with respect to the P-type channel transistor M11 can be changed.

Second Embodiment

Figure 2:
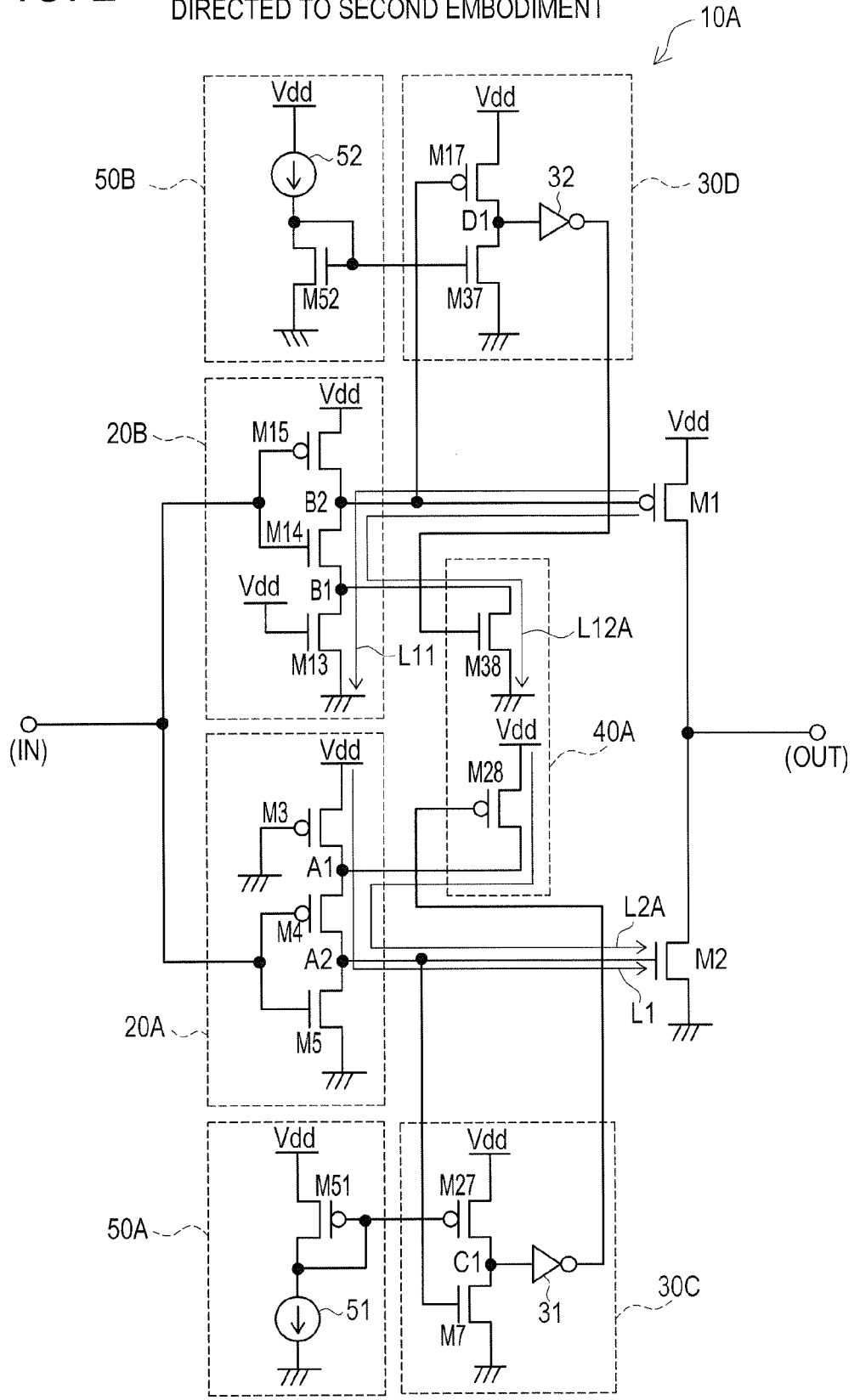
FIG. 2 is a circuit configuration diagram of an output buffer circuit directed to a second embodiment.

The second embodiment of the present disclosure will be described while referring to FIG. 2. FIG. 2 is a circuit configuration diagram of an output buffer circuit 10A of the present embodiment. Here, elements which are the same as those in the first embodiment are denoted by the same numerical symbols, to thereby simplify the description. The output buffer circuit 10A is provided with a P-type channel transistor M1, an N-type channel transistor M2, first gate voltage control circuits 20A and 20B, second gate voltage detecting circuits 30C and 30D, a third gate voltage control circuit 40A, and gate bias circuits 50A and 50B. The second gate voltage detecting circuits 30C and 30D correspond to the detecting portions of the present disclosure. The third gate voltage control circuit 40A corresponds to the auxiliary driving portion of the present disclosure.

The second gate voltage detecting circuit 30C is provided with the N-type channel transistor M7, the P-type channel transistor M27 and an inverter 31. A drain of the N-type channel transistor M7 is serially connected to the drain of the P-type channel transistor M27. A source of the N-type channel transistor M27 is connected to a power supply voltage Vdd (power supply line). A connection point C1 between a drain of the N-type channel transistor M7 and a drain of the P-type channel transistor M27 is connected to the input of the inverter 31.

The second gate voltage detecting circuit 30D is provided with a P-type channel transistor M17, an N-type channel transistor M37 and an inverter 32. A drain of the P-type channel transistor M17 is serially connected to a drain of the N-type channel transistor M37. A source of the N-type channel transistor M37 is serially connected to a ground. A connection point D1 between a drain of the P-type channel transistor M17 and a drain of the N-type channel transistor M37 is connected to an input of the inverter 32.

The gate bias circuit 50A is provided with a P-type channel transistor M51 and a constant current source 51. The source of the P-type channel transistor M51 is connected to the power supply voltage Vdd (power supply line). A gate of the P-type channel transistor M51 is connected to a gate of the P-type channel transistor M27 which is provided in a second gate voltage detecting circuit 30C.

The gate and the drain in the P-type channel transistor M51 are short-circuited. The drain of the P-type channel transistor M51 is connected to the ground through the constant current source 51.

The gate bias circuit 50B is provided with an N-type channel transistor M52 and a constant current source 52. A drain of the N-type channel transistor M52 is connected to the power supply voltage Vdd (power supply line) through the constant current source 52. The drain and the gate in the N-type channel transistor M52 are short-circuited. A gate of the N-type channel transistor M52 is connected to a gate of the N-type channel transistor M37 which is provided in a second gate voltage detecting circuit 30D. A source of the N-type channel transistor M52 is connected to the ground.

The third gate voltage control circuit 40A is provided with a P-type channel transistor M28 and an N-type channel transistor M38. A source of the P-type channel transistor M28 is connected to the power supply voltage Vdd (power supply line). A gate of the P-type channel transistor M28 is connected to the output of the inverter 31 which is provided in the second gate voltage detecting circuit 30C. A drain of the P-type channel transistor M28 is connected to a connection point A1 of the first gate voltage control circuit 20A. The P-type channel transistor M28 corresponds to the third switching element of the present disclosure. A gate of the P-type channel transistor M28 is connected to the connection point C1 through the inverter 31, which means that this corresponds to the third control terminal of the third switching element according to the present disclosure.

A source of the N-type channel transistor M38 is connected to the ground. A gate of the N-type channel transistor M38 is connected to an output of the inverter 32 which is provided in the second gate voltage detecting circuit 30D. A drain of the N-type channel transistor M38 is connected to a connection point B1 of the first gate voltage control circuit 20B. The N-type channel transistor M38 corresponds to the third switching element of the present disclosure. The gate of the N-type channel transistor M38 is connected to the connection point D1 through the inverter 32, which means that this corresponds to the third control terminal of the third switching element according to the present disclosure.

Next, the operation of the output buffer circuit 10A according to the present embodiment will be described. If the data signal inputted from the input terminal (IN) is changed from a high level to a low level, the output buffer circuit 10A operates in the following manner.

Right after the data input signal is changed from a high level to a low level, the gate voltage of the N-type channel transistor M7 does not reach the threshold voltage. Thus, the OFF state of the N-type channel transistor M7 is maintained.

In the present embodiment, the P-channel transistor M51 of the gate bias circuit 50A and the P-type channel transistor M27 of the second gate voltage detecting circuit 30C constitute a current mirror circuit. The P-type channel transistor M27 functions as a constant current source and runs a current corresponding to the output current of the constant current source 51 from the power supply line into the connection point C1. The P-type channel transistor M27 corresponds to the current source of the present disclosure.

The input of the inverter 31 receives a high level signal based on the potential occurring at the connection point C1. The inverter 31 outputs a low level signal to the gate of the P-type channel transistor M28. As a result, the gate voltage of the P-type channel transistor M28 is fixed to a low level voltage, so that the P-type channel transistor M28 is maintained in an ON state.

Then, the output buffer circuit 10A operates in the same manner as the output buffer circuit 10 of the first embodiment. In the output buffer circuit 10A, a source current path L2A is formed as shown in the drawing, in addition to the source current path L1, in a manner similar to that in the first embodiment. As a result, similarly with the first embodiment, the current driving capability of the source current path with respect to the N-type channel transistor M2 is increased, so that the time required by the gate voltage of the N-type channel transistor M2 to approximate to the threshold voltage is shortened. The source current path L2A extends from the power supply line to the gate of the N-type channel transistor M2, by passing through the P-type channel transistor M28 and further, through the P-type channel transistor M4.

As a result of the gate voltage of the N-type channel transistor M2 exceeding the threshold voltage, when the gate voltage of the N-type channel transistor M7 exceeds the threshold voltage, the inverter 31 outputs a high level signal to the gate of the P-type channel transistor M28, similarly with the first embodiment. As a result, the P-type channel transistor M28 enters an OFF state, and the source current path L2A is blocked. Thus, similarly with the first embodiment, the current driving capability of the source current path with respect to the N-type channel transistor M2 is decreased, and the speed at which the gate voltage is boosted is delayed in comparison with the boost speed required by the gate voltage of the N-type channel transistor M2 to reach the threshold voltage.

On the other hand, right after the data input signal is changed from a low level to a high level, the gate voltage of the P-type channel transistor M17 does not reach the threshold voltage. Thus, the P-type channel transistor M17 is maintained in an OFF state.

In the present embodiment, the N-type channel transistor M52 of the gate bias circuit 50B and the N-type channel transistor M37 of the second gate voltage detecting circuit 30D constitute a current mirror circuit. The N-type channel transistor M37 functions as a constant current source, and flows a current corresponding to the output current of the constant current source 52 into the transistor M37. The N-type channel transistor M37 corresponds to the current source of the present disclosure.

The input of the inverter 32 receives a low level signal based on the potential (ground potential) at the connection point D1. The inverter 32 outputs a high level signal to the gate of the N-type channel transistor M38. As a result, the gate voltage of the N-type channel transistor M38 is fixed to a high level voltage, so that the N-type channel transistor M38 is maintained in an ON state.

Then, the output buffer circuit 11A operates in the same manner as the output buffer circuit 10 of the first embodiment. Thus, similarly with the first embodiment, a sink current path L12A as illustrated is formed in the output buffer circuit 10A, in addition to the sink current path L11. As a result, similarly with the first embodiment, the current driving capability of the sink current path with respect to the P-type channel transistor M1 is increased, which shortens the time required by the gate of the P-type channel transistor M1 to approximate to the threshold voltage. The sink current path L12A extends from the gate of the P-type channel transistor M1 to the ground, by passing through the N-type channel transistor M38 via the N-type channel transistor M14.

Further, as a result of the gate voltage of the P-type channel transistor M1 reaching the threshold voltage, when the gate voltage of the P-type channel transistor M17 reaches the threshold value, the P-type channel transistor M17 enters an ON state. When the P-type channel transistor M17 enters an ON state, the potential at the connection point D1 is changed. The input of the inverter 32 receives a high level signal based on the potential at the connection point D1.

The inverter 32 outputs a low level signal to the gate of the N-type channel transistor M38. As a result, the N-type channel transistor M38 enters an OFF state, so that the sink current path L12A is blocked. Thus, similarly with the first embodiment, the current driving capability of the sink current path with respect to the P-type channel transistor M1 is decreased, and the speed at which the gate voltage is stepped down is delayed as compared to the step down speed at which the gate voltage of the P-type channel transistor M1 reaches the threshold voltage.

Effects of the Second Embodiment

In the output buffer circuit 10A according to the present embodiment, the second gate voltage detecting circuit 30C is provided with a P-type channel transistor M27 which is connected to the N-type channel transistor M7 and functions as a constant current source, and the second gate voltage detecting circuit 30D is provided with an N-type channel transistor M37 which is connected to the P-type channel transistor M17 and functions as a constant current source. In the output buffer circuit 10A, when the N-type channel transistor M7 enters an ON state or an OFF state, the potential occurring at the connection point C1 between the transistor M7 and the P-type channel transistor M27 is changed, and when the P-type channel transistor M17 enters an ON state or an OFF state, the potential occurring at the connection point D1 between the transistor M17 and the N-type channel transistor M37 is changed. Here, in the output buffer circuit 10A, a detection can be made that the N-type channel transistor M2 and the N-type channel transistor M7 have entered an ON state or an OFF state, and a detection can be made that the P-type channel transistor M1 and the P-type channel transistor M17 have entered an ON state or an OFF state, depending on the change in the potential occurring at connection C1 and D1. Thus, in the output buffer circuit 10A, a detection can be made as to whether the gate voltages of the transistors M2 and M1 have reached the threshold voltage based on the result that a detection is made that the N-type channel transistor M2 and the P-type channel transistor M1 have entered in an ON state or an OFF state.

In the output buffer circuit 10A of the present embodiment, the third gate voltage control circuit 40A is provided with a P-type channel transistor M28 that has a gate connected to the connection point C1 through the inverter 31, and is also provided with the N-type channel transistor M38 which has a gate connected to the connection point D1 through the inverter 32. In the output buffer circuit 10A, the gate voltages of the transistors M28 and M38 can be changed in accordance with a change in the potentials occurring at the connection points C1 and D1. Here, in the output buffer circuit 10A, the transistors M28 and M38 can be controlled to enter an ON state or an OFF state in accordance with the gate voltages of the transistors M28 and M38, so as to form the source current path L2A and the sink current path L12A, or block the source current path L2A and the sink current path L12A. Therefore, as a result of forming or blocking the source current path L2A in the output buffer circuit 10A, the current driving capability of the source current path with respect to the N-type channel transistor M2 can be changed. Also, as a result of forming or blocking the sink current path L12A, the current driving capability of the sink current path with respect to the P-type channel transistor M1 can be changed.

Third Embodiment

Figure 3:
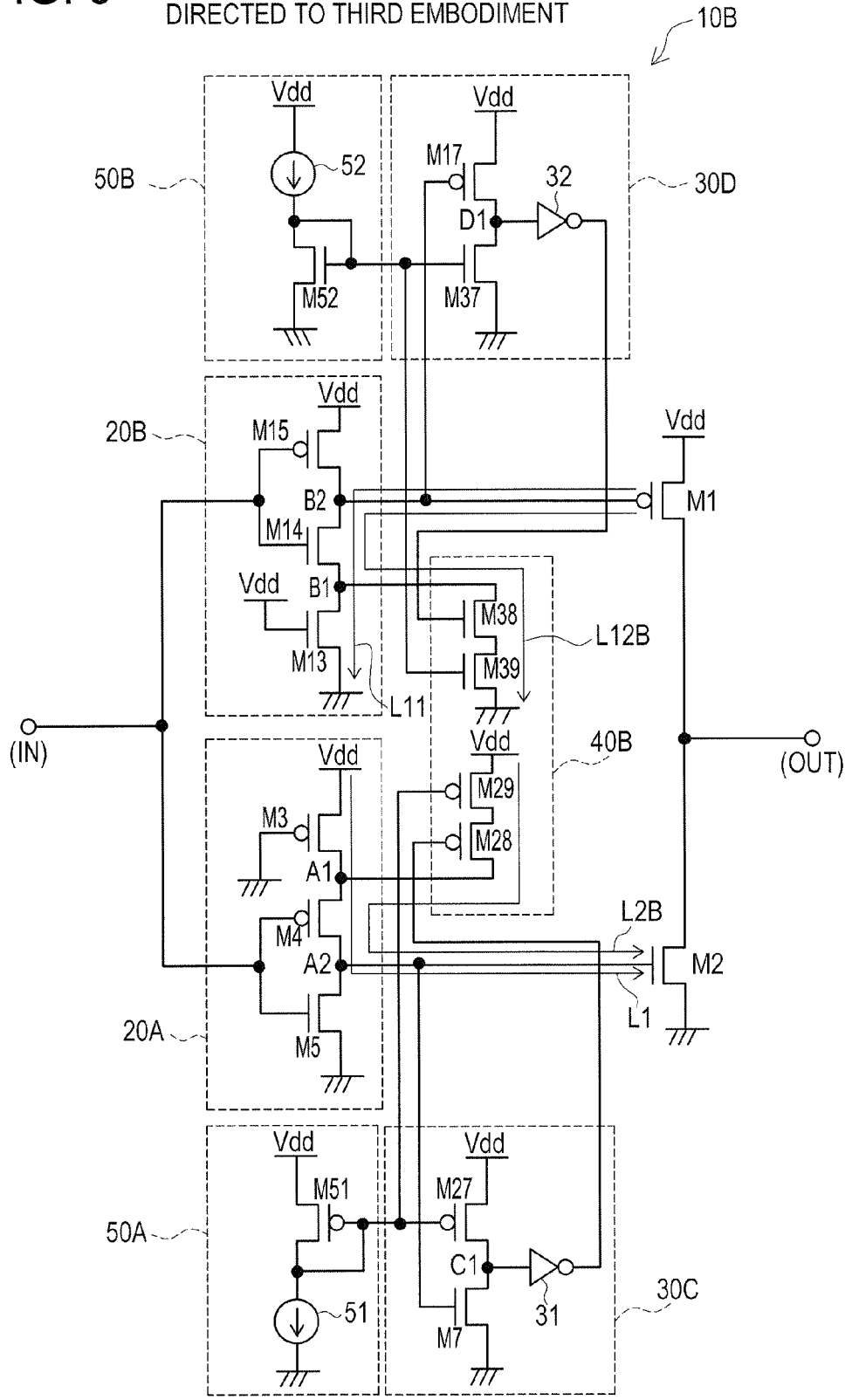
FIG. 3 is a circuit configuration diagram of an output buffer circuit directed to a third embodiment.

The third embodiment of the present disclosure will be described while referring to FIG. 3. FIG. 3 is a circuit configuration diagram of an output buffer circuit 10B of the present embodiment. Here, elements which are the same as those in the first and second embodiments are denoted by the same numerical symbols, to thereby simplify the description. The output buffer circuit 10B is provided with a fourth gate voltage control circuit 40B instead of the third gate voltage control circuit 40A of the second embodiment. The fourth gate voltage control circuit 40B corresponds to the auxiliary driving portion of the present disclosure.

The fourth gate voltage control circuit 40B is provided with a P-type channel transistor M28, a P-type channel transistor M29, an N-type channel transistor M38, and an N-type channel transistor M39.

A source of the P-type channel transistor M29 is connected to a power supply voltage Vdd (power supply line). A gate of the P-type channel transistor M29 is connected to a gate of a P-type channel transistor M51 which is provided in a gate bias circuit 50A and a gate of a P-type channel transistor M27 in a second gate voltage detecting circuit 30C. A drain of the P-type channel transistor M29 is connected to a source of a P-type channel transistor M28. A gate of the P-type channel transistor M28 is connected to an output of an inverter 31 which is provided in the second gate voltage detecting circuit 30C. A drain of the P-type channel transistor M28 is connected to a connection point A1 of a first gate voltage control circuit 20A. The P-type channel transistor M29 corresponds to the fourth switching element of the present disclosure.

A source of the N-type channel transistor M39 is connected to a ground (low potential power supply) A gate of the N-type channel transistor M39 is connected to a gate of an N-type channel transistor M52 which is provided in a gate bias circuit 50B and a gate of an N-type channel transistor M37 in a second gate voltage detecting circuit 30D. A drain of the N-type channel transistor M39 is connected to a source of the N-type channel transistor M38. The N-type channel transistor M39 corresponds to the fourth switching element of the present disclosure.

A gate of the N-type channel transistor M38 is connected to an output of an inverter 32 which is provided in the second gate voltage detecting circuit 30D. A drain of the N-type channel transistor M38 is connected to a connection point B1 of a first gate voltage control circuit 20B.

Next, the operation of the output buffer circuit 10B according to the present embodiment will be described. If the data signal inputted from the input terminal (IN) is changed from a high level to a low level, the output buffer circuit 10B operates in the following manner.

Similarly with the second embodiment, right after the data input signal is changed from a high level to a low level, the OFF state of an N-type channel transistor M7 is maintained. As described above, the P-type channel transistor M27 functions as a constant current source. An input of the inverter 31 receives a high level signal, based on the potential occurring at the connection point C1. The inverter 31 outputs a low level signal to the gate of the P-type channel transistor M28. As a result, the P-type channel transistor M28 enters an ON state.

In addition, the gate of the P-type channel transistor M29 is connected to the gate of the P-type channel transistor M51 and the gate of the P-type channel transistor M27. The current vale of the constant current source 51 is set so that the gate voltages of the transistors M29, M51 and M27 become near the threshold voltage. Here, when the P-type channel transistor M51 and the P-type channel transistor M27 enter an ON state, the P-type transistor M29 also enters an ON state. The gate of the P-type channel transistor M29 is connected to the gate of the P-type channel transistor M27 which functions as a constant current source, which means that this corresponds to the fourth control terminal of the fourth switching element according to the present disclosure.

At this time, a P-type channel transistor M4 which is provided in the first gate voltage control circuit 20A is in an ON state and hence the transistors M29, M28 and M4 simultaneously enter in an ON state. Thus, a source current path L2B is formed as shown in the drawing. The source current path L2B extends from the power supply line to a gate of an N-type channel transistor M2, by passing through the P-type channel transistors M28 and M29 and further, through the connection point A1, the P-type channel transistor M4 and a connection point A2. In the output buffer circuit 10B, a source current path L1 is formed in addition to the source current path L2B, in a manner similar to that in the second embodiment.

On the other hand, right after the data input signal is changed from a low level to a high level, the OFF state of a P-type channel transistor M17 is maintained. As described above, the N-type channel transistor M37 functions as a constant current source. An input of the inverter 32 receives a low level signal based on the potential (ground potential) at the connection point D1. The inverter 32 outputs a high level signal to the gate of the N-type channel transistor M38. As a result, the N-type channel transistor M38 enters an ON state.

In addition, in the present embodiment, the gate of the N-type channel transistor M39 is connected to the gate of the N-type channel transistor M52 and the gate of the N-type channel transistor M37. The current value of the constant current source 52 is set so that the gate voltages of the transistors M39, M52 and M37 become near the threshold voltage. Here, when the N-type channel transistor M52 and the N-type channel transistor M37 enter an ON state, the N-type channel transistor M39 also enters an ON state. The gate of the N-type channel transistor M39 is connected to the gate of the N-type channel transistor M37 which functions as a constant current source, which means that this corresponds to the fourth control terminal of the fourth switching element of the present disclosure.

At this time, the N-type channel transistor M14 is in an ON state and hence the transistors M14, M38 and M39 simultaneously in an ON state. As a result, a sink current path L12B is formed as shown in the drawing. The sink current path L12B extends from the gate of a P-type channel transistor M1 to the ground, by passing through a connection point B2, the N-type channel transistor M14 and a connection point B1, and further through the N-type channel transistors M38 and M39. In the output buffer circuit 10B, a sink current path L11 is formed in addition to the sink current path L12B, similarly with the second embodiment.

Effects of the Third Embodiment

In the output buffer circuit 10B according to the present embodiment, the fourth gate voltage control circuit 40B is provided with a P-type channel transistor M29 which is connected between the P-type channel transistor M28 and the power supply line and is provided with a gate which is connected to the P-type channel transistor M27 which functions as a constant current source. The fourth gate voltage control circuit 40B is further provided with the N-type channel transistor M39 which is connected between the N-type channel transistor M38 and the ground and is provided with a gate which is connected to the N-type channel transistor M37 which functions as a constant current source. In the output buffer circuit 10B, a constant current to be drawn from the power supply line through the P-type channel transistor can control a gate voltage of the P-type channel transistor M29. At the same time, a constant current flowing into the N-type channel transistor M37 can control a gate voltage of the N-type channel transistor M39. As a result, in the output buffer circuit 10B, the constant current can control gate voltages of the transistors M29 and M39 and keep constant the time required by the gate voltages of the transistors M2 and M1 to reach the threshold voltage, based on the current driving capability of the source current path L2B and the current driving capability of the sink current path L12B.

Fourth Embodiment

Figure 4:
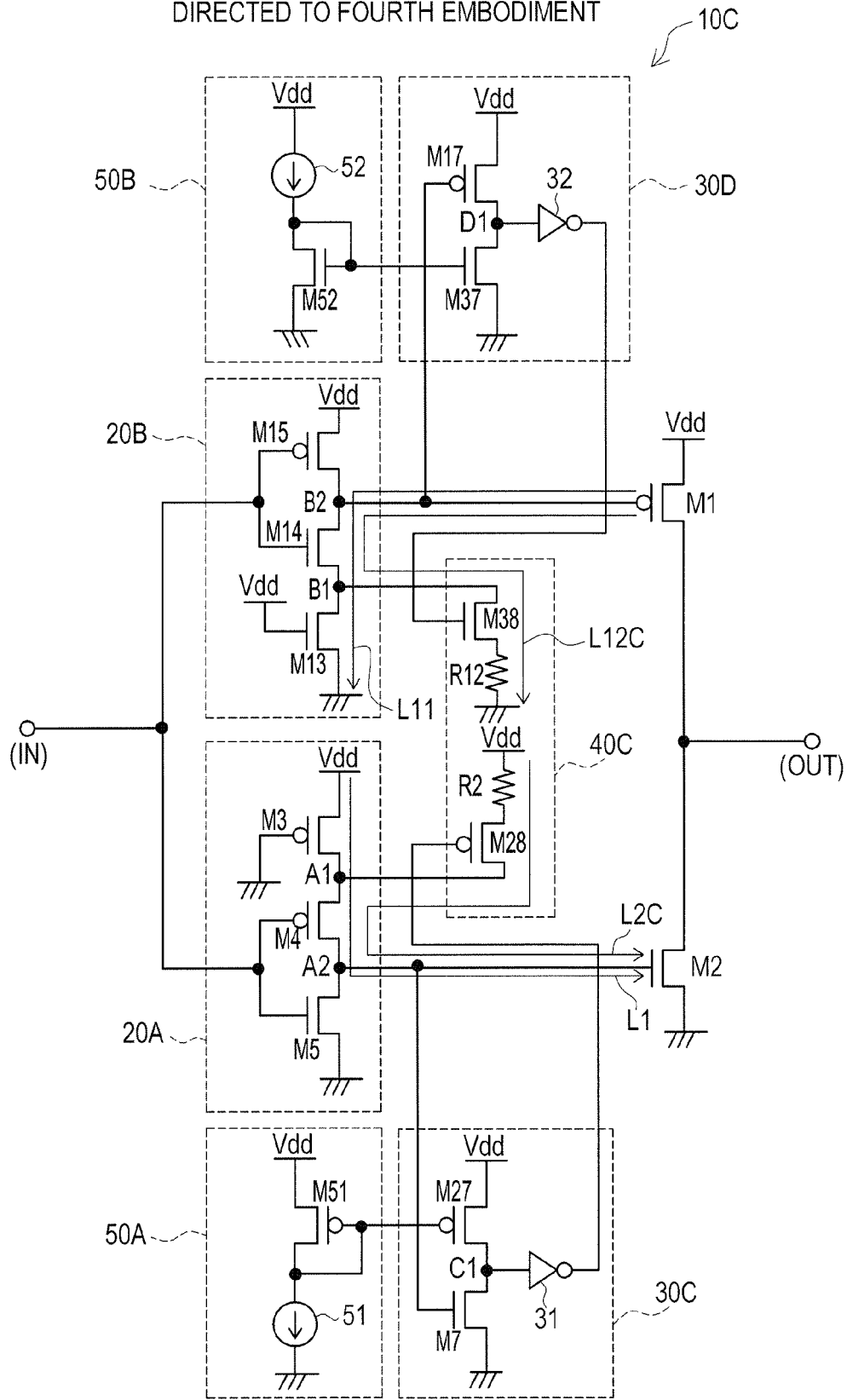
FIG. 4 is a circuit configuration diagram of an output buffer circuit directed to a fourth embodiment.

The fourth embodiment of the present disclosure will be described while referring to FIG. 4. FIG. 4 is a circuit configuration diagram of an output buffer circuit 10C of the present embodiment. Here, elements which are the same as those in the first to third embodiments are denoted by the same numerical symbols, to thereby simplify the description. The output buffer circuit 10C is provided with a fifth gate voltage control circuit 40C instead of the third gate voltage control circuit 40A of the second embodiment. The fifth gate voltage control circuit 40C corresponds to the auxiliary driving portion of the present disclosure.

The fifth gate voltage control circuit 40C is provided with a resistor R2, a P-type channel transistor M28, an N-type channel transistor M38 and a resistor R12. One terminal of the resistor R2 is connected to a power supply voltage Vdd (power supply line). The other terminal of the resistor R2 is connected to a source of the P-type channel transistor M28. A gate of the P-type channel transistor M28 is connected to an output of an inverter 31 of a second gate voltage detecting circuit 30C in a manner similar to that in the second and third embodiments. A drain of the P-type channel transistor M28 is connected to a connection point A1 of a first gate voltage control circuit 20A. The resistor R2 corresponds to the second resistor element of the present disclosure.

One terminal of the resistor R12 is connected a ground (low potential power supply). The other terminal of the resistor R12 is connected to a source of the N-type channel transistor M38. A gate of the N-type channel transistor M38 is connected to an output of an inverter 32 of a second gate voltage detecting circuit 30D. A drain of the N-type channel transistor M38 is connected to a connection point B1 of a first gate voltage control circuit 20B. The resistor R12 corresponds to the second resistor element of the present disclosure.

Next, the operation of the output buffer circuit 10C according to the present embodiment will be described. If the data signal to be inputted from the input terminal (IN) is changed from a high level to a low level, the output buffer circuit 10C operates as will be described in the following text.

Right after the data input signal is changed from a high level to a low level, the inverter 31 outputs a low level signal to the gate of the P-type channel transistor M28 in a manner similar to that in the second and third embodiments. As a result, the P-type channel transistor M28 enters an ON state.

At this time, a P-type channel transistor M4 which is provided in the first gate voltage control circuit 20A is in an ON state, similarly with the second and third embodiments, and hence the transistors M28 and M4 simultaneously enter in an ON state. As a result, a source current path L2C is formed as shown in the drawing. The source current path L2C extends from the power supply line to a gate of an N-type channel transistor M2 by passing through the resistor R2 and the P-type channel transistor M28 and further, through the connection point A1, the P-type channel transistor M4 and a connection point A2.

The current to be supplied from the power supply line to the source current path L2C is restricted by the resistor R2 and the current value in the source current path L2C is suppressed. In the output buffer circuit 10C, a source current path L1 is formed in addition to the source current path L2C in a similar manner to that in the second and third embodiments.

On the other hand, right after the data input signal is changed from a low level to a high level, similarly with the second and third embodiments, the inverter 32 outputs a high level signal to the gate of the N-type channel transistor M38. As a result, the N-type channel transistor M38 enters an ON state.

At this time, similarly with the second and third embodiments, the N-type channel transistor M14 which is provided in the first gate voltage control circuit 20B is in an ON state and hence the transistors M14 and M38 simultaneously enter in an ON state. Thus, a sink current path L12C is formed as shown in the drawing. The sink current path L12C extends from a gate of a P-type channel transistor M1 to the ground by passing through a connection point B2, the N-type channel transistor M14 and the connection point B1 and further, through the N-type channel transistor M38 and the resistor R12.

In the present embodiment, the resistor R12 restricts the current to be drawn to the ground. In the output buffer circuit 10C, a sink current path L11 is formed in addition to the sink current path L12C.

Effects of the Fourth Embodiment

In the output buffer circuit 10C according to the present embodiment, the fifth gate voltage control circuit 40C is provided with the resistor R2 which is connected between the source of the P-type channel transistor M28 and the power supply line and the resistor R12 which is connected between the ground and the source of the N-type channel transistor M38. Here, in the output buffer circuit 10C, adjusting of the resistance value of the resistors R2 and R12 can restrict the current value to be supplied from the power supply line to the source current path L2C within a certain range, or the current value to be drawn to the ground of the sink current path L12C within a certain range. Thus, in the output buffer circuit 10C, the current driving capability of the sink current path L2C with respect to the N-type channel transistor M2 and the current driving capability of the sink current path L12C with respect to the P-type channel transistor M1 can be respectively set within a certain range. As a result, the time required by the gate voltages of the transistors M2 and M1 to reach the threshold voltage can be set within a certain range.

Fifth Embodiment

Figure 5:
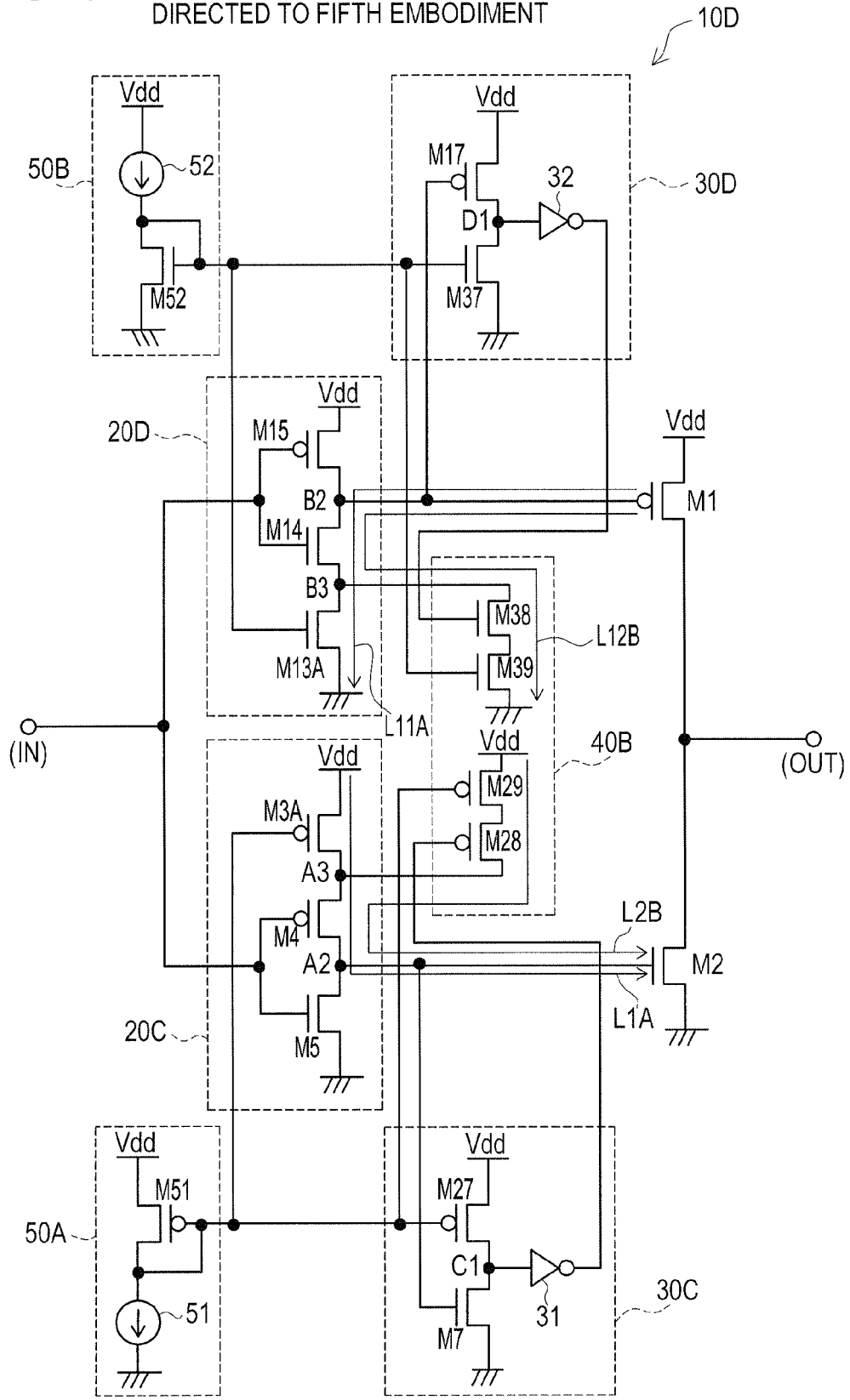
FIG. 5 is a circuit configuration diagram of an output buffer circuit directed to a fifth embodiment.

The fifth embodiment of the present disclosure will described while referring to FIG. 5. FIG. 5 is a circuit configuration diagram of an output buffer circuit 10D of the present embodiment. Here, elements which are the same those in the first to fourth embodiments are denoted by the same numeric symbols, to thereby simplify the description. The output buffer circuit 10D is provided with sixth gate voltage control circuits 20C and 20D instead of the first gate voltage control circuits 20A and 20B of the output buffer circuit 10B of the third embodiment. The sixth gate voltage control circuits 20C and 20D correspond to the driving portions of the present disclosure.

The sixth voltage control circuit 20C is provided with a P-type channel transistor M3A, a P-type channel transistor M4 and an N-type channel transistor M5. The P-type channel transistor M3A corresponds to the fifth switching element of the present disclosure. A gate of the P-type channel transistor M3A is connected to a gate of a P-type channel transistor M27 which is provided in a second gate voltage detecting circuit 30C and a gate of a P-type channel transistor M51 in a gate bias circuit 50A.

A drain of the P-type channel transistor M3A is connected to a source of the P-type channel transistor M4. A connection point A3 between the drain of the P-type channel transistor M3A and the source of the P-type channel transistor M4 is connected to a drain of a P-type channel transistor M28 which is provided in a fourth gate voltage control circuit 40B.

The sixth gate voltage control circuit 20D is provided with an N-type channel transistor M13A, an N-type channel transistor M14 and a P-type channel transistor M15. The P-type channel transistor M13A corresponds to the fifth switching element of the present embodiment. A gate of the N-type channel transistor M13A is connected to a gate of an N-type channel transistor M37 which is provided in a second gate voltage detecting circuit 30D and a gate of an N-type channel transistor M52 in a gate bias circuit 50B. A drain of the N-type channel transistor M13A is connected to a source of the N-type channel transistor M14. A connection point B3 between the drain of the N-type channel transistor M13A and the source of the N-type channel transistor M14 is connected to a drain of an N-type channel transistor M38 which is provided in the fourth gate voltage control circuit 40B.

Next, the operation of an output buffer circuit 10D according to the present embodiment will be described. If the data signal to be inputted from the input terminal (IN) is changed from a high level to a low level, the output buffer circuit 10D operates as will be described in the following text.

In the present embodiment, the current value of a constant current source 51 is set so that the gate voltages of the transistors M3A, M51 and M27 become near the threshold voltage. When the P-type channel transistors M51 and M27 enter an ON state, the P-type transistor M3A also enters an ON state.

In the present embodiment, a gate voltage of the P-type channel transistor M3A is set based on the current of the constant current source 51. As a result, in the present embodiment, the time required by the gate voltage of the P-type channel transistor M3A to reach the threshold voltage is controlled to be kept constant based on the current of the constant current source 51. The gate of the P-type channel transistor M3A is connected to the gate of the P-type channel transistor M27 which functions as a constant current source, which means that this corresponds to the fifth control terminal of the fifth switching element of the present disclosure.

When the data input signal is changed from a high level to a low level, the P-type channel transistor M4 which is provided in the sixth gate voltage control circuit 20C enters an ON state and hence the transistors M3A and M4 simultaneously enter in an ON state. Thus, a source current path L1A is formed as shown in the drawing. The source current path L1A extends from the power supply line to a gate of an N-type channel transistor M2, by passing through the transistors M3A and M4 and further, through a connection point A2.

In the output buffer circuit 10D, a source current path L2B is formed in addition to the source current path L1A in a manner similar to that in the third embodiment. In the present embodiment, the gate voltage of a P-type channel transistor M29 is also set based on the current from the constant current source 51. As a result, in a manner similar to that in the P-type channel transistor M3A, the time required by the gate voltage of the P-type channel transistor M29 to reach the threshold voltage is controlled to be kept constant.

On the other hand, if the data input signal is changed from a low level to a high level, the output buffer circuit 10D of the present embodiment operates in the following manner. In the present embodiment, the current value of a constant current source 52 is set so that the gate voltages of the transistors M13A, M52 and M37 become near the threshold voltage. When the N-type channel transistor M52 and the N-type channel transistor M37 enter an ON state, the N-type transistor 13A also enters an ON state.

In the present embodiment, the gate voltage of the N-type channel transistor 13A is set based on the current of the constant current source 52. As a result, the time required by the gate voltage of the N-type channel transistor M13A to reach the threshold voltage is controlled to be kept constant based on the current of the constant current source 52 in the present embodiment. The gate of the N-type channel transistor M13A is connected to the gate of the N-type channel transistor M37 which functions as a constant current source, which means that this corresponds to the fifth control terminal of the fifth switching element of the present disclosure.

When the data input signal is changed from a high level to a low level, the N-type channel transistor M14 which is provided in the sixth gate voltage control circuit 20D enters an ON state and hence the transistors M14 and M13A simultaneously enter in an ON state. Thus, a sink current path L11A is formed as shown in the drawing. The sink current path L11A extends from a gate of a P-type channel transistor M1 to the ground, by passing through the N-type channel transistor M14 and the N-type channel transistor M13A.

In the output buffer circuit 10D, a sink current path L12B is formed in addition to the sink current path L11A in a manner similar to that in the third embodiment. In the present embodiment, the gate voltage of an N-type channel transistor M39 is also set based on the current from the constant current source 52. As a result, in a manner similar to that in the N-type channel transistor M13A, the time required by the gate voltage of the N-type channel transistor M39 to reach the threshold voltage is controlled to be kept constant.

Effects of the Fifth Embodiment

In the output buffer circuit 10D according to the present embodiment, the sixth gate voltage control circuit 20C is provided with the P-type channel transistor M3A which has a gate which is connected to the P-type channel transistor M27 which functions as a constant current source, and the sixth gate voltage control circuit 20D is provided with the N-type channel transistor M13A which has a gate which is connected to the N-type channel transistor power M37 which functions as a constant current source. In the output buffer circuit 10D, a constant current to be drawn from the power supply line through the P-type channel transistor M27 can control a gate voltage of the N-type channel transistor M3A. At the same time, a constant current which flows into the N-type channel transistor M37 can control a gate voltage of the N-type channel transistor M13A. As a result, in the output buffer circuit 10D, the constant current can control gate voltages of the transistors M3A and M13A and keep the time required by the gate voltages of the transistors M2 and M1 to reach the threshold voltage constant, based on the current driving capability of the source current path L1A and the current driving capability of the sink current path L11A. Consequently, the delay in responding to the data input signal can be prevented.

Sixth Embodiment

Figure 6:
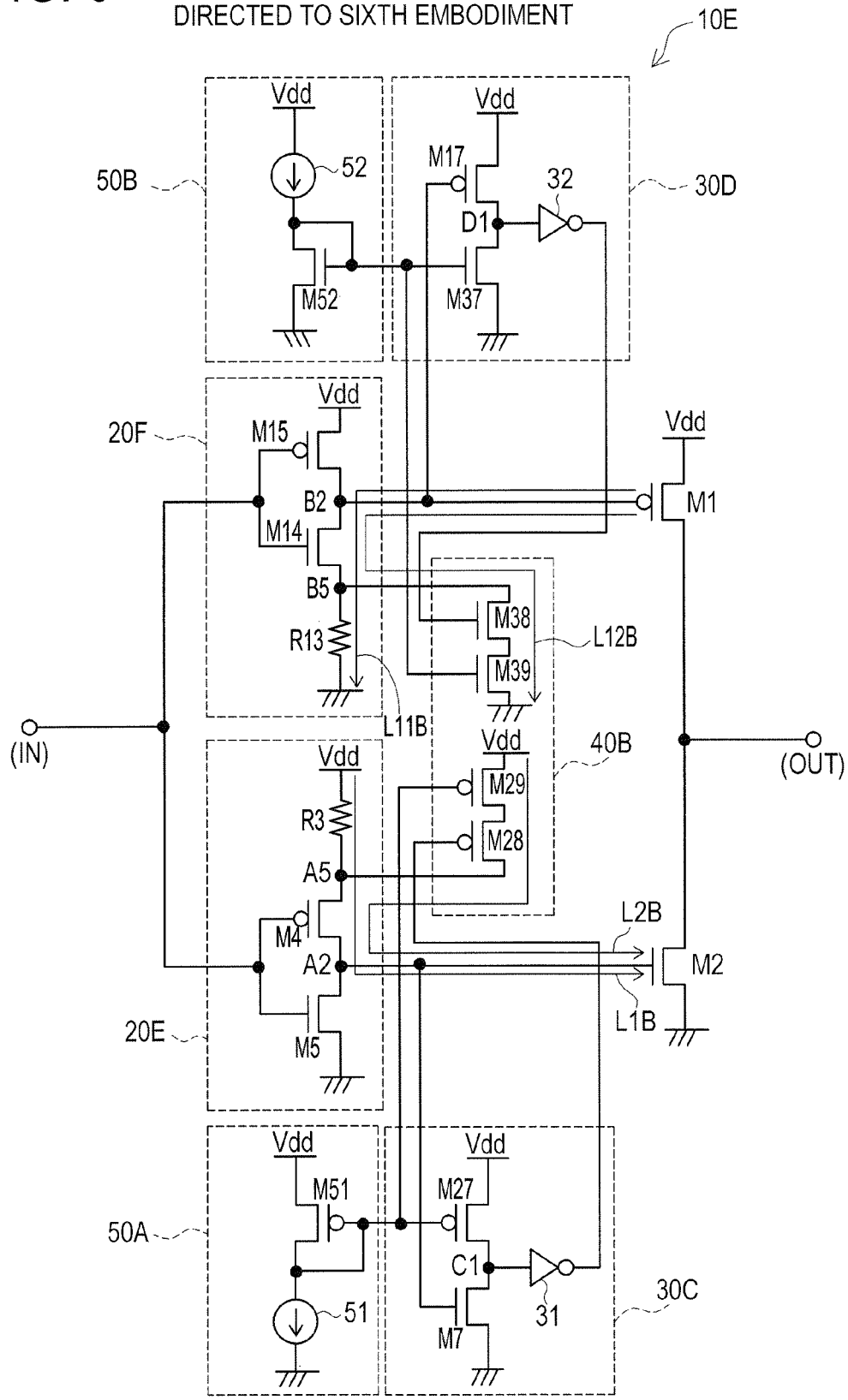
FIG. 6 is a circuit configuration diagram of an output buffer circuit directed to a sixth embodiment.

The sixth embodiment of the present disclosure will be described while referring to FIG. 6. FIG. 6 is a circuit configuration diagram of an output buffer circuit 10E of the present embodiment. Here, elements which are the same as those in the first to fifth embodiments are denoted by the same numerical symbols, to thereby simplify the description. The output buffer circuit 10E is provided with seventh gate voltage control circuits 20E and 20F instead of the sixth gate voltage control circuits 20C and 20D of the output buffer circuit 10D of the fifth embodiment. The seventh gate voltage control circuits 20E and 20F correspond to the driving portions of the present disclosure.

The seventh gate voltage control circuit 20E is provided with a resistor R3, a P-type channel transistor M4, and an N-type channel transistor M5. The resistor R3 corresponds to the third resistor element of the present disclosure. The P-type channel transistor M4 corresponds to the sixth switching element of the present disclosure.

One terminal of the resistor R3 is connected to a power supply voltage Vdd (power supply line). The other terminal of the resistor R3 is connected to a source of the P-type channel transistor M4. A connection point A5 between the other terminal of the resistor R3 and the source of the P-type channel transistor M4 is connected to a drain of a P-type channel transistor M28 which is provided in a fourth gate voltage control circuit 40B.

The seventh gate voltage control circuit 20F is provided with a resistor R13, an N-type channel transistor M14, and a P-type channel transistor M15. The resistor R13 corresponds to the third resistor element of the present disclosure. The N-type channel transistor M14 corresponds to the sixth switching element of the present disclosure.

One terminal of the resistor R13 is connected to a ground (low potential power supply). The other terminal of the resistor R13 is connected to a source of the N-type channel transistor M14. A connection point B5 between the other terminal of the resistor R13 and the source of the N-type channel transistor M14 is connected to a drain of an N-type channel transistor M38 which is provided in the fourth gate voltage control circuit 40B.

Next, the operation of the output buffer circuit 10E according to the present embodiment will be described. If the data input signal to be inputted from the input terminal (IN) is changed from a high level to a low level, the output buffer circuit 10E operates as will be described in the following text.

When the data input signal is changed from a high level to a low level, the P-type channel transistor M4 which is provided in the seventh gate voltage control circuit 20E enters an ON state. Thus, a source current path L1B is formed as shown in the drawing. The source current path L1B extends from the power supply line to a gate of an N-type channel transistor M2, by passing through the resistor R3 and the P-type channel transistor M4 and further, through a connection point A2.

The current to be supplied from the power supply line to the source current path L1B is restricted by the resistor R3 and the current value in the source current path L1B is suppressed. In the present embodiment, the value of the current to be supplied to the gate of the N-type channel transistor M2 is kept constant in accordance with the difference of the resistance value of the resistor R3.

On the other hand, if the data input signal is changed from a low level to a high level, the output buffer circuit 10E operates in the following manner. If the data input signal is changed from a low level to a high level, the P-type channel transistor M14 which is provided in the seventh gate voltage control circuit 20F enters an ON state. As a result, a sink current path L11B is formed as shown in the drawing. The sink current path L11B extends from a gate of a P-type channel transistor M1 to the ground, by passing through a connection point B2 and the N-type channel transistor M14.

In the present embodiment, the resistor R13 restricts the current to be drawn to the ground. As a result, in the present embodiment, the value of the current to be drawn to the ground is kept constant in accordance with the difference of the resistance value of the resistor R13.

Effects of the Sixth Embodiment

In the output buffer circuit 10E according to the present embodiment, the seventh gate voltage control circuit 20E is provided with the resistor R3 which is connected between the P-type channel transistor M4 which is connected to the gate of the N-type channel transistor M2 and the power supply line. Further, the seventh gate voltage control circuit 20F is provided with the resistor R13 which is connected between the N-type channel transistor M14 which is connected to the gate of the P-type channel transistor M1 and the ground. The adjusting of the resistance values of the resistors R3 and R13 in the output buffer circuit 10E helps restrict the value of the current to be supplied from the power supply line to the source current path L1B within a constant range or restrict the value of the current to, which the sink current path L11B draws to the ground, within a constant range. As a result, in the output buffer circuit 10E, the current restricted within a constant range makes it possible to control the gate voltages of the transistors M2 and M1 and to restrict the time required by the gate voltages of the transistors M2 and M1 to reach the threshold value within a constant range, based on the current driving capability of the source current path L1B and the current driving capability of the sink current path L11B. Consequently, the delay in responding to the data input signal can be prevented.

It is to be noted that the present disclosure is not limited to the embodiments described above, and is possible various improvements and modifications by the range in which it does not deviate from the scope of the disclosure.

According to the buffer circuit and the control method thereof according to the present disclosure, if the driving capability of the output switching element is changed in accordance with a detection result if the voltage value of the control terminal of the output switching element exceeds the threshold voltage or not, the voltage value of the control terminal of the output switching element can be increased or decreased, depending on the driving capability of the output switching element which is set in accordance with the detection result. According to the buffer circuit and the control method thereof according to the present disclosure, if the voltage value of the control terminal of the output switching element is increased, the output switching element can be quickly changed from a non-conductive state into a conductive state, which allows increasing the slew rate of the buffer circuit. If the voltage value of the control terminal of the output switching element is decreased, the conductive state of the output switching element can be restricted, so that the slew rate of the buffer circuit can be returned to a standard value based on the driving capability of the output switching element set in advance.

What is claimed is:

1. A buffer circuit comprising:
    a driving portion which drives an output switching element;
    a detecting portion which detects that a voltage value of a control terminal of the output switching element has exceeded a threshold voltage value; and
    an auxiliary driving portion connected to the driving portion, wherein:
    the auxiliary driving portion changes driving capability of the output switching element so as to decrease, in case a signal received by the driving portion changes from low level to high level or in case the signal changes from high level to low level, in accordance with a result of detection by the detecting portion, and
    the detecting portion is provided with:
        a first switching element having an element structure same as the output switching element, wherein the first switching element has a first control terminal which is connected to the control terminal of the output switching element; and
        a first resistor element arranged between a power supply and a ground, wherein the first resistor element is serially connected to the first switching element.

2. A buffer circuit comprising:
    a driving portion which drives an output switching element;
    a detecting portion which detects that a voltage value of a control terminal of the output switching element has exceeded a threshold voltage value; and
    an auxiliary driving portion connected to the driving portion, wherein the auxiliary driving portion changes driving capability of the output switching element so as to decrease, in case a signal received by the driving portion changes from low level to high level or in case the signal changes from high level to low level, in accordance with a result of detection by the detecting portion, and is provided with a second switching element having a second control terminal, wherein the second control terminal is connected to a connection point between a first resistor element and a first switching element, wherein the first resistor element is arranged between a power supply and a ground and is serially connected to the first switching element which has an element structure same as the output switching element and has a first control terminal which is connected to the control terminal of the output switching element.

3. A buffer circuit comprising:
    a driving portion which drives an output switching element
    a detecting portion which detects that a voltage value of a control terminal of the output switching element has exceeded a threshold voltage value; and
    an auxiliary driving portion connected to the driving portion, wherein:
    the auxiliary driving portion changes driving capability of the output switching element so as to decrease, in case a signal received by the driving portion changes from low level to high level or in case the signal changes from high level to low level, in accordance with a result of detection by the detecting portion, and
    the detecting portion is provided with:
        a first switching element having an element structure same as the output switching element, wherein the first switching element has a first control terminal which is connected to the control terminal of the output switching element; and
        a current source serially connected to the first switching element.

4. A buffer circuit comprising:
    a driving portion which drives an output switching element;
    a detecting portion which detects that a voltage value of a control terminal of the output switching element has exceeded a threshold voltage value; and
    an auxiliary driving portion connected to the driving portion, wherein the auxiliary driving portion changes driving capability of the output switching element so as to decrease, in case a signal received by the driving portion changes from low level to high level or in case the signal changes from high level to low level, in accordance with a result of detection by the detecting portion, and is provided with a third switching element having a third control terminal connected to a connection point between a current source and a first switching element, wherein the current source is serially connected to the first switching element having a first control terminal which is connected to the control terminal of the output switching element.

5. The buffer circuit according to claim 4, wherein the auxiliary driving portion is provided with a fourth switching element connected between the third switching element and a power supply, wherein the fourth switching element has a fourth control terminal connected to the current source.

6. The buffer circuit according to claim 4, wherein the auxiliary driving portion is provided with a second resistor element connected between the third switching element and a power supply.

7. A buffer circuit comprising:
    a driving portion which drives an output switching element;
    a detecting portion which detects that a voltage value of a control terminal of the output switching element has exceeded a threshold voltage value; and
    an auxiliary driving portion connected to the driving portion, wherein:
    the auxiliary driving portion changes driving capability of the output switching element so as to decrease, in case a signal received by the driving portion changes from low level to high level or in case the signal changes from high level to low level, in accordance with a result of detection by the detecting portion, and
    the driving portion is provided with a fifth switching element having a fifth control terminal which is connected to a current source, wherein the current source is serially connected to a first switching element having an element structure same as the output switching element and is connected to the control terminal of the output switching element.

8. A buffer circuit comprising:
    a driving portion which drives an output switching element;
    a detecting portion which detects that a voltage value of a control terminal of the output switching element has exceeded a threshold voltage value; and
    an auxiliary driving portion connected to the driving portion, wherein:

the auxiliary driving portion changes driving capability of the output switching element so as to decrease, in case a signal received by the driving portion changes from low level to high level or in case the signal changes from high level to low level, in accordance with a result of detection by the detecting portion, and the driving portion is provided with a third resistor element connected between a sixth switching element and a power supply, wherein the sixth switching element is connected to the control terminal of the output switching element.

9. A buffer circuit comprising:

a driving portion which drives an output switching element;

a detecting portion which detects that a voltage value of a control terminal of the output switching element has exceeded a threshold voltage value; and an auxiliary driving portion connected to the driving portion, wherein:

the auxiliary driving portion changes driving capability of the output switching element in accordance with a result of detection by the detecting portion, and the detecting portion is provided with:

a first switching element having a same element structure as the output switching element, wherein the first switching element has a first control terminal which is connected to the control terminal of the output switching element; and a first resistor element arranged between a power supply and a ground, wherein the first resistor element is serially connected to the first switching element.

10. The buffer circuit according to claim 9, wherein the auxiliary driving portion is provided with a second switching element having a second control terminal, wherein the second control terminal is connected to a connection point between the first resistor element and the first switching element.

11. The buffer circuit according to claim 9, wherein the detecting portion is provided with a current source serially connected to the first switching element.

12. The buffer circuit according to claim 9, wherein the auxiliary driving portion is provided with a third switching element having a third control terminal connected to a connection point between a current source and the first switching element, wherein the current source is serially connected to the first switching element.

13. The buffer circuit according to claim 12, wherein the auxiliary driving portion is provided with a fourth switching element connected between the third switching element and a power supply, wherein the fourth switching element has a fourth control terminal connected to the current source.

14. The buffer circuit according to claim 12, wherein the auxiliary driving portion is provided with a second resistor element connected between the third switching element and a power supply.

15. The buffer circuit according to claim 9, wherein the driving portion is provided with a fifth switching element having a fifth control terminal which is connected to a current source, wherein the current source is serially connected to the first switching element.

16. The buffer circuit according to claim 9, wherein the driving portion is provided with a third resistor element connected between a sixth switching element and a power supply, wherein the sixth switching element is connected to the control terminal of the output switching element.

* * * * *